US012597820B2

(12) United States Patent
Chang

(10) Patent No.: US 12,597,820 B2
(45) Date of Patent: Apr. 7, 2026

(54) ELECTRICAL ASSEMBLY STRUCTURE AND MOTORS WITH ELECTRICAL ASSEMBLY STRUCTURE

(71) Applicant: SUNONWEALTH ELECTRIC MACHINE INDUSTRY CO., LTD., Kaohsiung City (TW)

(72) Inventor: En-Cheng Chang, Kaohsiung City (TW)

(73) Assignee: SUNONWEALTH ELECTRIC MACHINE INDUSTRY CO., LTD., Kaohsiung City (TW)

( * ) Notice: Subject to any disclaimer, the term of this patent is extended or adjusted under 35 U.S.C. 154(b) by 267 days.

(21) Appl. No.: 18/522,785

(22) Filed: Nov. 29, 2023

(65) Prior Publication Data

US 2024/0364170 A1 Oct. 31, 2024

(30) Foreign Application Priority Data

Apr. 25, 2023 (TW) ................................. 112115342

(51) Int. Cl.
*H02K 3/44* (2006.01)
*H02K 3/50* (2006.01)
(Continued)

(52) U.S. Cl.
CPC ................. *H02K 3/44* (2013.01); *H02K 3/50* (2013.01); *H02K 11/33* (2016.01); *H05K 5/064* (2013.01);
(Continued)

(58) Field of Classification Search
CPC . H02K 3/44; H02K 3/50; H02K 11/33; H02K 2203/06; H02K 2211/03;
(Continued)

(56) References Cited

U.S. PATENT DOCUMENTS 8,328,578 B2 * 12/2012 Csak ................. B29C 45/14639
439/606
10,208,853 B2 * 2/2019 Roos ....................... F16H 61/32
(Continued)

FOREIGN PATENT DOCUMENTS

CN 115706480 A 2/2023
TW 201532372 A 8/2015

*Primary Examiner* — Tulsidas C Patel
*Assistant Examiner* — Mohammed Ahmed Qureshi
(74) *Attorney, Agent, or Firm* — WPAT, PC

(57) ABSTRACT

An electrical assembly structure includes electric circuitry, a first waterproof layer, and a second waterproof layer. The electric circuitry includes an electric unit and a lead wire electrically connected to the electric unit. The lead wire includes an inner section, an outer section, and an intermediate section between the inner section and the outer section. The inner section is connected to the electric unit. The first waterproof layer covers the electric unit and the inner section. The second waterproof layer covers the intermediate section and is connected to the first waterproof layer. The second waterproof layer is located between the outer section and the first waterproof layer. The outer section is exposed outside the second waterproof layer. A material of the second waterproof layer is softer than a material of the first waterproof layer. Motors including the electrical assembly structure are also disclosed.

8 Claims, 5 Drawing Sheets

(51) Int. Cl.
    *H02K 11/33*         (2016.01)
    *H05K 5/06*         (2006.01)

(52) U.S. Cl.
    CPC ...... *H02K 2203/06* (2013.01); *H02K 2211/03*
                             (2013.01)

(58) Field of Classification Search
    CPC ............ H02K 5/08; H02K 5/10; H02K 5/225;
                    H05K 5/064; H05K 1/02; H05K 1/11;
                                  H05K 1/181
    See application file for complete search history.

(56)                     References Cited

U.S. PATENT DOCUMENTS

| | | | |
|---|---|---|---|
| 2013/0077264 A1* | 3/2013 | Schwulst | .............. H05K 3/284 |
| | | | 29/829 |
| 2023/0045464 A1 | 2/2023 | Yamasaki et al. | |

* cited by examiner

ELECTRICAL ASSEMBLY STRUCTURE AND MOTORS WITH ELECTRICAL ASSEMBLY STRUCTURE

CROSS REFERENCE TO RELATED APPLICATION

The application claims the benefit of Taiwan application serial No. 112115342, filed on Apr. 25, 2023, and the entire contents of which are incorporated herein by reference.

BACKGROUND OF THE INVENTION

1. Field of the Invention

The present invention relates to an electrical assembly structure and motors and, more particularly, to a waterproof electrical assembly structure and motors with the electrical assembly structure.

2. Description of the Related Art

A conventional electrical assembly structure may include a casing and electric circuitry. The electric circuitry is located in the casing and includes a lead wire. A waterproof layer of the electrical assembly structure is filled into the casing and may cover the gaps between the electric circuitry and other components. The lead wire extends through the waterproof layer and is partially exposed outside the waterproof layer for connection with an external power and for control.

However, when the above conventional electrical assembly structure is in an environment under a high water pressure, the lead wire is apt to deform under high pressure, resulting in gaps between the lead wire and the waterproof layer. As a result, external liquid will infiltrate the electrical assembly structure via the gaps to cause malfunction of the electric circuitry or corrosion of other components, thereby adversely affecting operation of the electrical assembly structure.

Thus, it is necessary to improve the conventional electrical assembly structure.

SUMMARY OF THE INVENTION

To solve the above problems, it is an objective of the present invention to provide an electrical assembly structure and a motor with the electrical assembly structure, such that even if the lead wire deforms, external liquid can still be prevented from flowing into the electrical assembly structure.

It is another objective of the present invention to provide an electrical assembly structure and a motor with the electrical assembly structure, which can avoid breakage and disengagement of the lead wire.

It is a further objective of the present invention to provide an electrical assembly structure and a motor with the electrical assembly structure, which can provide a better waterproof effect It is still another objective of the present invention to provide an electrical assembly structure and a motor with the electrical assembly structure, which can permit easy detachment and easy assembly.

As used herein, the term "a", "an" or "one" for describing the number of the elements and members of the present invention is used for convenience, provides the general meaning of the scope of the present invention, and should be interpreted to include one or at least one. Furthermore, unless explicitly indicated otherwise, the concept of a single component also includes the case of plural components.

As used herein, the term "engagement", "coupling", "assembly", or similar terms is used to include separation of connected members without destroying the members after connection or inseparable connection of the members after connection. A person having ordinary skill in the art would be able to select according to desired demands in the material or assembly of the members to be connected.

An electrical assembly structure according to the present invention includes electric circuitry, a first waterproof layer, and a second waterproof layer. The electric circuitry includes an electric unit and a lead wire electrically connected to the electric unit. The lead wire includes an inner section, an outer section, and an intermediate section between the inner section and the outer section. The inner section is connected to the electric unit. The first waterproof layer covers the electric unit and the inner section. The second waterproof layer covers the intermediate section and is connected to the first waterproof layer. The second waterproof layer is located between the outer section and the first waterproof layer. The outer section is exposed outside the second waterproof layer. A material of the second waterproof layer is softer than a material of the first waterproof layer.

In an aspect, a motor according to the present invention includes a stator and a rotor. The stator includes a casing unit and the above-mentioned electrical assembly structure. The electric circuitry is located in the casing unit. The electric unit of the electric circuitry includes a coil unit electrically connected to the lead wire. The rotor is rotatably mounted to the stator.

In another aspect, a motor according to the present invention includes a stator and a rotor. The stator includes a casing unit and a plurality of the above-mentioned electrical assembly structures. The casing unit is an annular member comprised of a plurality of casing parts. Each of the plurality of electrical assembly structures is coupled with a respective one of the plurality of casing parts, such that each electric circuitry is located in the casing unit. The electric unit of each electric circuitry includes a coil unit electrically connected to a respective lead wire. The rotor is rotatably mounted to the stator.

Accordingly, in the electrical assembly structure and the motor including the electrical assembly structure according to the present invention, aside from the first waterproof layer covering the electric unit and the inner section, the second waterproof layer is further provided to cover the intermediate section and is connected to the first waterproof layer. Furthermore, the material of the second waterproof layer is softer than the material of the first waterproof layer. When the lead wire is subject to a pressure and forms the deformation area, the second waterproof layer can immediately fill the deformation area due to the softness characteristics of the second waterproof layer per se. This avoids external liquid from flowing into the electric unit via the deformation area, thereby achieving a waterproof function under high pressure. Furthermore, in a motor having a plurality of electrical assembly structures, by the coupling between each of the plurality of electrical assembly structures and a respective casing part, the stator forms a plurality of independently separable items. If any electrical assembly structure is damaged, only the damaged electrical assembly structure needs to be removed for replacement or maintenance, which is convenient for repairing and detachment/assembly.

In an example, the first waterproof layer may be made of polyurethane or thermosetting material. Thus, the plurality of electronic elements of the circuit board can be prevented from dampness which may cause damage or short circuit, thereby providing enhanced waterproof effect.

In an example, the second waterproof layer may be made of polymer material, rubber or silicone. Thus, the second waterproof layer can easily fill the deformation area.

In an example, the first waterproof layer may be formed by potting or injection molding, thereby permitting easy manufacture.

In an example, the second waterproof layer may be formed by potting or injection molding, thereby permitting easy manufacture.

In an example, the electric unit may include a circuit board, and the inner section may be connected to the circuit board. Thus, the electric unit is simple in structure and easy to manufacture, thereby increasing the manufacturing convenience.

In an example, the electric unit may include a plurality of electronic elements disposed on the circuit board, and the first waterproof layer may cover the plurality of electronic elements. Thus, the first waterproof layer can protect the plurality of electronic elements of the electric unit, such that the plurality of electronic elements of the circuit board can be prevented from dampness which may cause damage or short circuit.

In an example, the casing unit may be made of a material identical to the material of the first waterproof layer, and the casing unit may be integrally connected to the first waterproof layer. Thus, the first waterproof layer can be formed while forming the casing unit, thereby permitting convenient manufacture.

In an example, the electric unit may include a circuit board electrically connected to the coil unit, and the inner section may be connected to the circuit board. Thus, the electric unit is simple in structure and easy to manufacture, thereby increasing the manufacturing convenience.

In an example, the electric unit may include a plurality of electronic elements disposed on the circuit board, and the first waterproof layer may cover the plurality of electronic elements. Thus, the first waterproof layer can protect the plurality of electronic elements of the electric unit, such that the plurality of electronic elements of the circuit board can be prevented from dampness which may cause damage or short circuit In an example, the lead wire may be integrally connected to the coil unit. Thus, the electric unit is simple in structure and easy to manufacture, thereby increasing the manufacturing convenience.

In an example, each of the plurality of electric units may include a circuit board which may be electrically connected to a respective coil unit, and each inner section may be connected to a respective circuit board. Thus, the electric unit is simple in structure and easy to manufacture, thereby increasing the manufacturing convenience.

In an example, each electric unit may include a plurality of electronic elements which is disposed on the respective circuit board, and each of the plurality of electronic elements may be covered by a respective first waterproof layer. Thus, each first waterproof layer can protect the plurality of electronic elements of the respective electric unit, such that the plurality of electronic elements can be prevented from dampness which may cause damage or short circuit.

In an example, each lead wire may be integrally connected to the respective coil unit. Thus, the electric unit is simple in structure and easy to manufacture, thereby increasing the manufacturing convenience.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
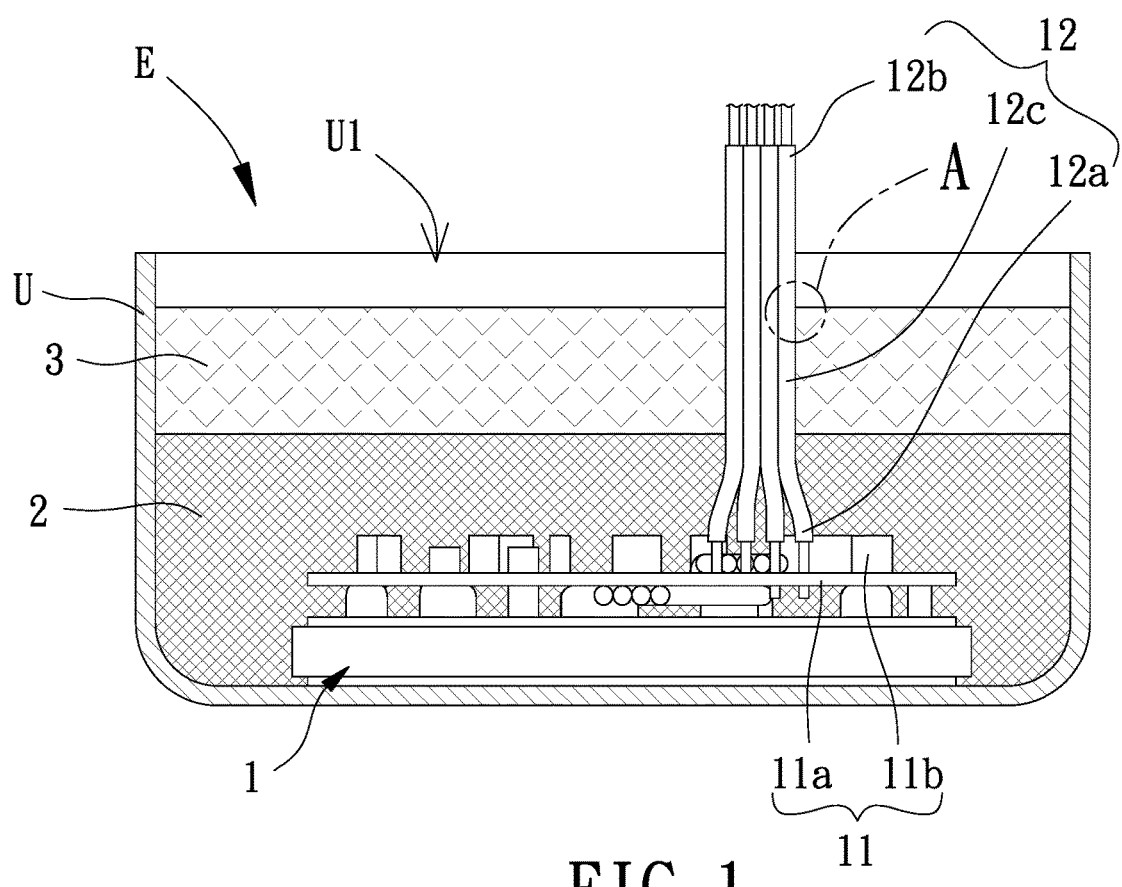
FIG. 1 is a cross sectional view of an electrical assembly structure of a preferred embodiment according to the present invention after assembly.

When the terms "front", "rear", "left", "right", "up", "down", "top", "bottom", "inner", "outer", "side", and similar terms are used herein, it should be understood that these terms have reference only to the structure shown in the drawings as it would appear to a person viewing the drawings and are utilized only to facilitate describing the invention, rather than restricting the invention.

DETAILED DESCRIPTION OF THE INVENTION

With reference to FIG. 1, an electrical assembly structure E of a preferred embodiment according to the present invention includes electric circuitry 1, a first waterproof layer 2, and a second waterproof layer 3. Each of the first waterproof layer 2 and the second waterproof layer 3 covers a portion of the electric circuitry 1.

The electric circuitry 1, the first waterproof layer 2, and the second waterproof layer 3 may be received in a case U. The type of the case U is neither limited in the present invention nor limited to the type shown in the figures disclosed in this embodiment. In this embodiment, the case U may include an opening U1.

The electric circuitry 1 includes an electric unit 11 and a lead wire 12 electrically connected to the electric unit 11. The electric unit 11 is coupled to the case U. However, the engagement between the electric unit 11 and the case U is not limited in the present invention. For example, the electric unit 11 is coupled to an interior of the case U by screwing, snapping, or male-female coupling. Moreover, in this embodiment, the electric unit 11 may include a circuit board 11a and a plurality of electronic elements 11b. The plurality of electronic elements 11b is located on a side of the circuit board 11a facing the opening U1. Furthermore, the lead wire 12 includes an inner section 12a and an outer section 12b. The inner section 12a is connected to the circuit board 11a of the electric unit 11. The outer section 12b may extend outward via the opening U1. The lead wire 12 further includes an intermediate section 12c between the inner section 12a and the outer section 12b.

The first waterproof layer 2 may completely cover the circuit board 11a. The first waterproof layer 2 may be made of, e.g., polyurethane (PU) or thermosetting material. The thermosetting material may be epoxy or a bulk molding compound (BMC). The PU and epoxy may be filled into the case U by potting. The BMC is suitable for injection molding and has features of light weight, high strength, resistance to heat and moisture, low shrinkage rate, and possible zero-degree draft angle. The first waterproof layer 2 may cover and, thus, protect the plurality of electronic elements 11b of the electric unit 11 from dampness which may cause damage or short circuit. Furthermore, the first waterproof layer 2 covers the inner section 12a of the lead wire 12. Namely, a portion of the lead wire 12 connected to the circuit board 11a can be covered by the first waterproof layer 2, and the lead wire 12 extends through the first waterproof layer 2, such that the outer section 12b of the lead wire 12 is exposed outside the first waterproof layer 2. Accordingly, the portion of the lead wire 12 connected to the circuit board 11a can be covered by the first waterproof layer 2 and is, thus, difficult to break or disengage.

Figure 2:
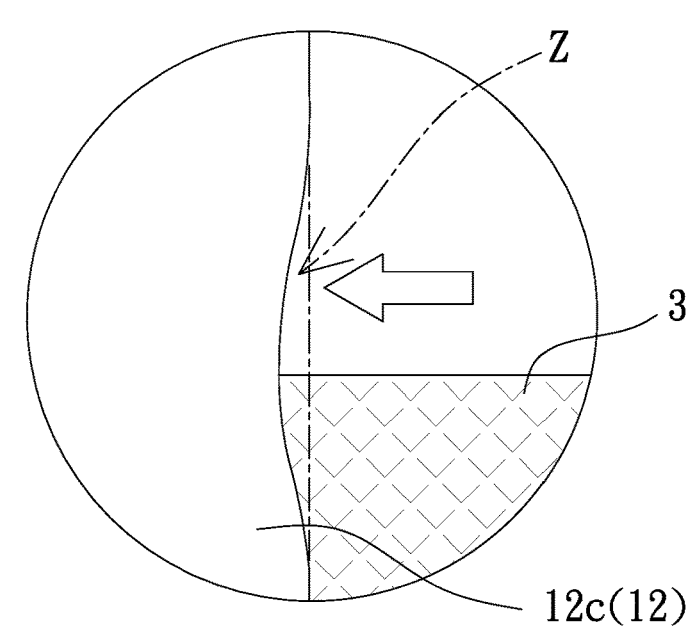
FIG. 2 is an enlarged view of a circled portion A of FIG. 1.

With reference to FIGS. 1 and 2, the second waterproof layer 3 is used to fill the gap formed by deformation of the lead wire 12 due to pressure, thereby preventing external liquid from flowing into the electric unit 11. The second waterproof layer 3 may be made of, e.g., polymer material, rubber or silicone. The second waterproof layer 3 is closer to the opening U1 than the first waterproof layer 2. The material of the second waterproof layer 3 is softer than the material of the first waterproof layer 2. Furthermore, the second waterproof layer 3 may be formed by potting or injection molding. The second waterproof layer 3 covers the intermediate section 12c of the lead wire 12 and is connected to the first waterproof layer 2. The second waterproof layer 3 is located between the outer section 12b and the first waterproof layer 2. The lead wire 12 extends through the second waterproof layer 3, such that the outer section 12b of the lead wire 12 is exposed outside the second waterproof layer 3. Therefore, the outer section 12b of the lead wire 12 can extend outward via the opening U1 to permit connection of the outer section 12b of the lead wire 12 with an external power or signal. In a case that the electrical assembly structure E according to the present invention is in an environment under a high water pressure (such as a diving vehicle), when the lead wire 12 is subject to a pressure and forms a deformation area Z, the second waterproof layer 3 can immediately fills the deformation area Z due to the softness characteristics of the second waterproof layer 3 per se. This avoids external liquid from flowing into the electric unit 11 via the deformation area Z, thereby achieving a waterproof function under high pressure.

Figure 3:
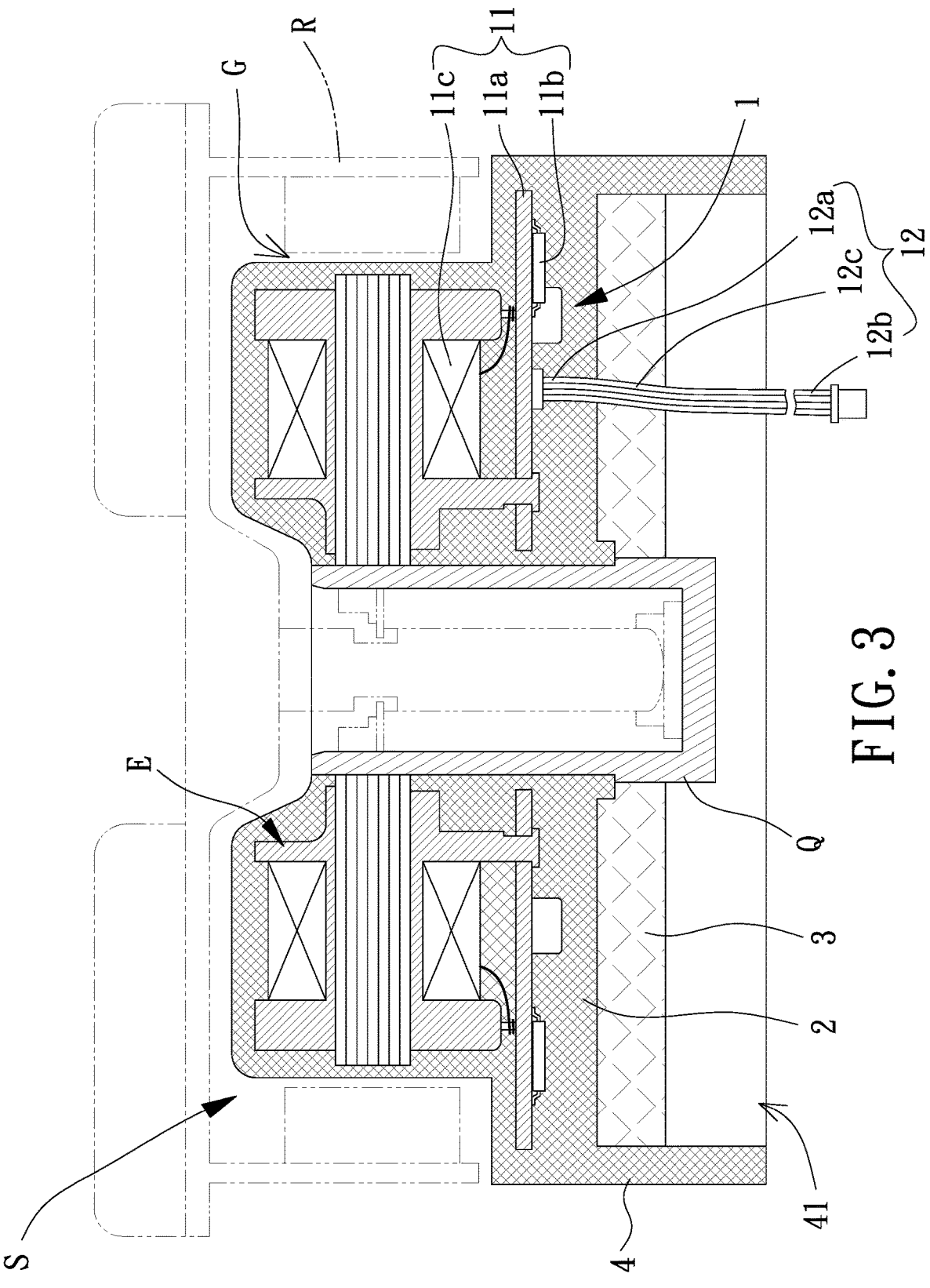
FIG. 3 is a cross sectional view illustrating application of the electrical assembly structure according to the present invention on an outer-rotor motor.

With reference to FIG. 3, the electrical assembly structure E is applicable to a motor. The motor may be an outer-rotor motor shown in FIG. 3. The motor includes a stator S and a rotor R rotatably mounted around the stator S. An air gap G is formed between the rotor R and the stator S. Specifically, the stator S may be disposed around a shaft tube Q. The stator S includes a casing unit 4 and the above-mentioned electrical assembly structure E. The electric circuitry 1 is located in the casing unit 4. The casing unit 4 may include an opening 41. The casing unit 4 and the first waterproof layer 2 may be integrally connected by potting or injection molding. Thus, the yield rate and efficiency of formation of the casing unit 4 and the first waterproof layer 2 can be increased.

Specifically, the electric unit 11 of the electric circuitry 1 includes a coil unit 11c electrically connected to the circuit board 11a. The inner section 12a of the lead wire 12 is connected to the circuit board 11a to provide electrical connection between the coil unit 11c and the lead wire 12. Thus, the electric unit 11 can control operation of the motor to rotate the rotor R relative to the stator S. The circuit board 11a, the electronic elements 11b, the coil unit 11c, and the inner section 12a of the lead wire 12 are covered by the first waterproof layer 2. The second waterproof layer 3 is closer to the opening 41 than the first waterproof layer 2. The second waterproof layer 3 covers the intermediate section 12c of the lead wire 12, such that the outer section 12b of the lead wire 12 is exposed outside the second waterproof layer 3. Thus, the outer section 12b of the lead wire 12 can extend outward via the opening 41 for connection with an external power or signal.

Figure 4:
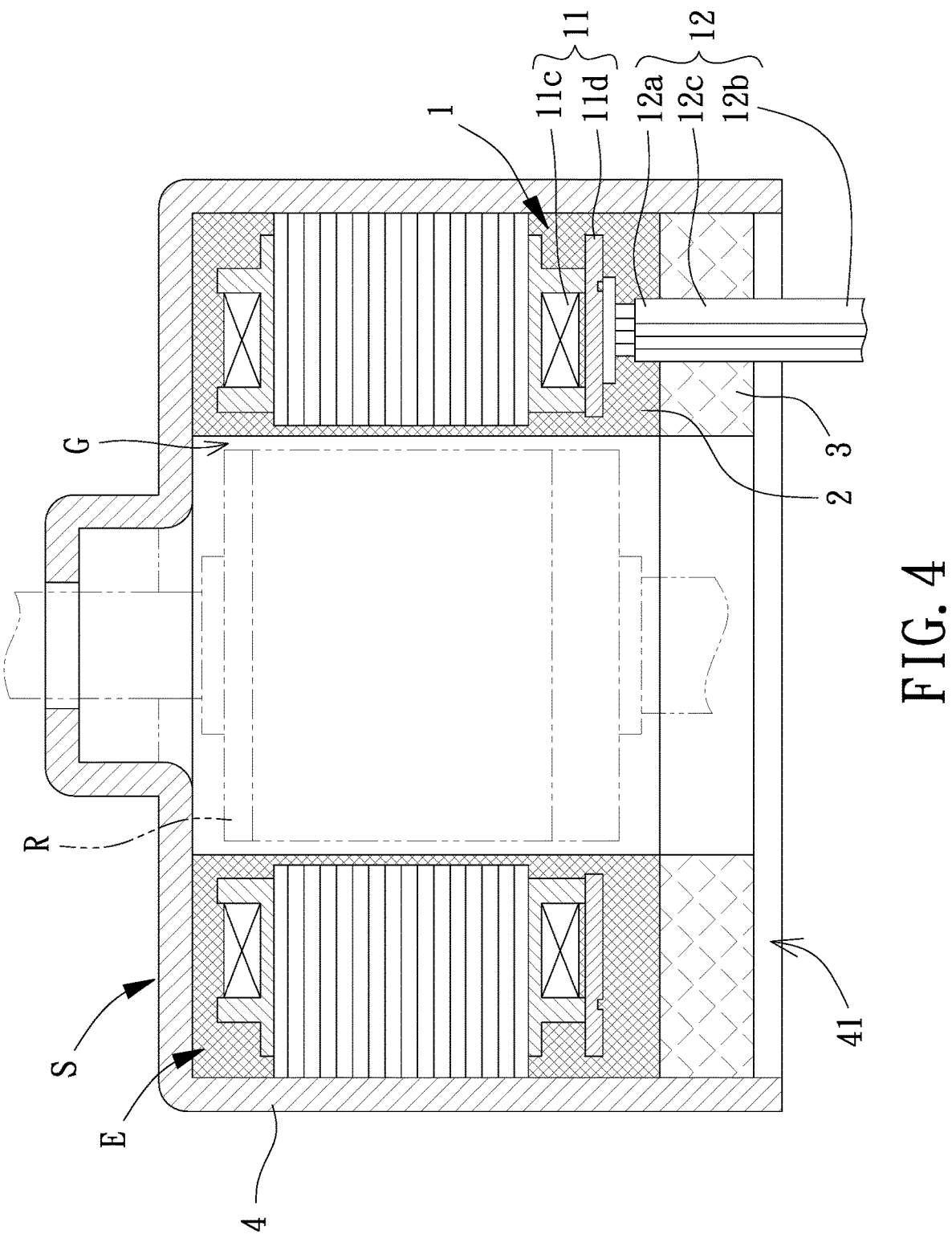
FIG. 4 is a cross sectional view illustrating application of the electrical assembly structure according to the present invention on an inner-rotor motor.

With reference to FIG. 4, in another embodiment, the motor may be an inner-rotor motor. The rotor R is rotatably mounted inside the stator S. The electric unit 11 may include an adaptor board 11d on which a circuit layout is disposed. The coil unit 11c is electrically connected to the adaptor board 11d. The inner section 12a of the lead wire 12 is connected to the adaptor board 11d to provide electrical connection between the coil unit 11c and the lead wire 12. The coil unit 11c, the adaptor board 11d, and the inner section 12a of the lead wire 12 are covered by the first waterproof layer 2. The second waterproof layer 3 is closer to the opening 41 than the first waterproof layer 2. The second waterproof layer 3 covers the intermediate section 12c of the lead wire 12, such that the outer section 12b of the lead wire 12 is exposed outside the second waterproof layer 3. Thus, the outer section 12b of the lead wire 12 can extend outward via the opening 41 for connection with an external power or signal. In other embodiments, the electric circuitry 1 may be free of the adaptor board 11d, and the lead wire 12 may be integrally connected to the coil unit 11c, as shown in FIG. 7, thereby simplifying the components.

With reference to FIGS. 2 and 3, in a case that the motor is in an environment under a high water pressure, due to provision of the second waterproof layer 3, when the lead wire 12 is subject to a pressure and forms a deformation area Z, the second waterproof layer 3 can immediately fills the deformation area Z due to the softness characteristics of the second waterproof layer 3 per se. This avoids external liquid from flowing into the electric unit 11 via the deformation area Z, thereby achieving a waterproof function under high pressure and, thus, prolonging the service life of the motor.

Figure 5:
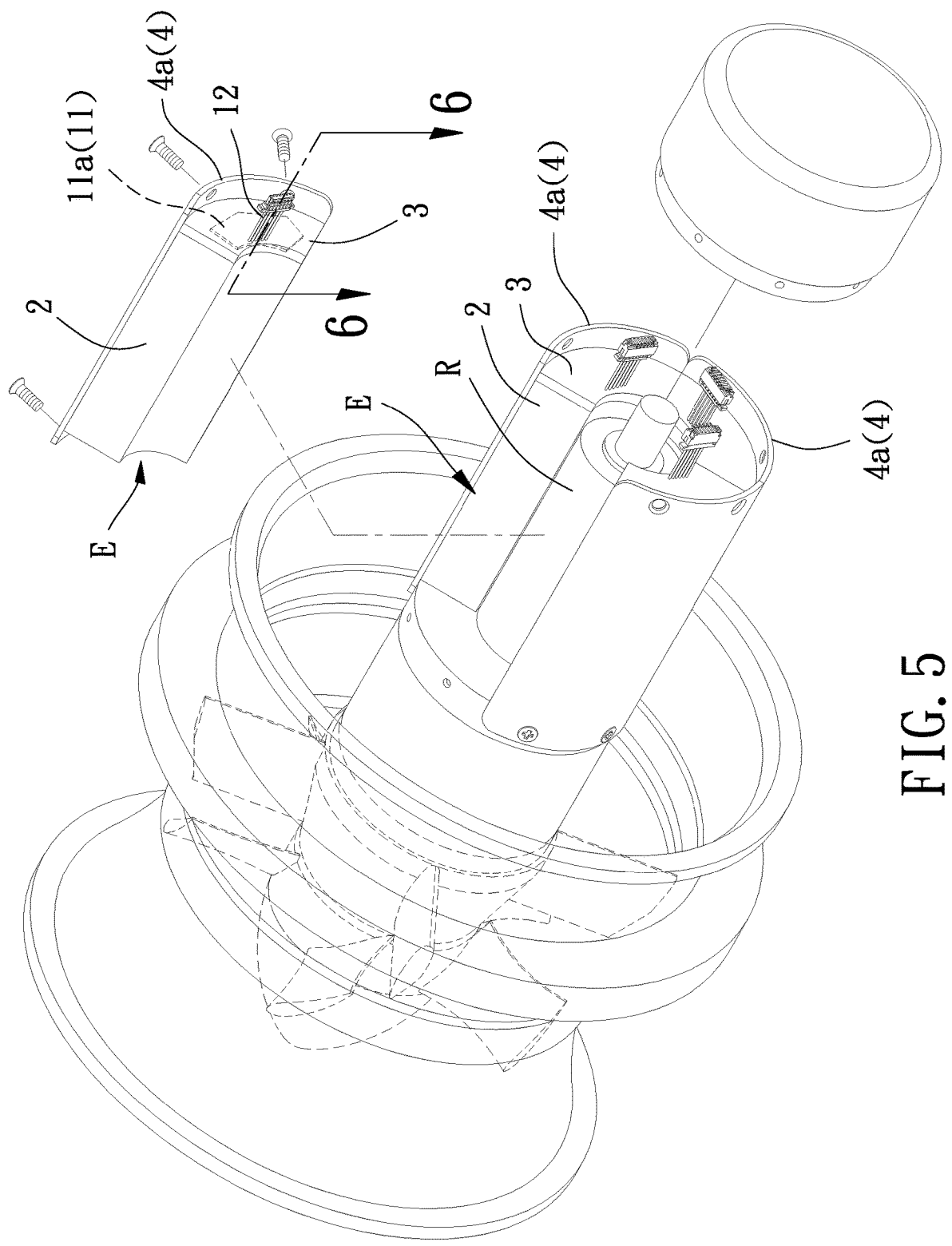
FIG. 5 is an exploded, perspective view illustrating application of the electrical assembly structure according to the present invention on an array motor.
Figure 6:
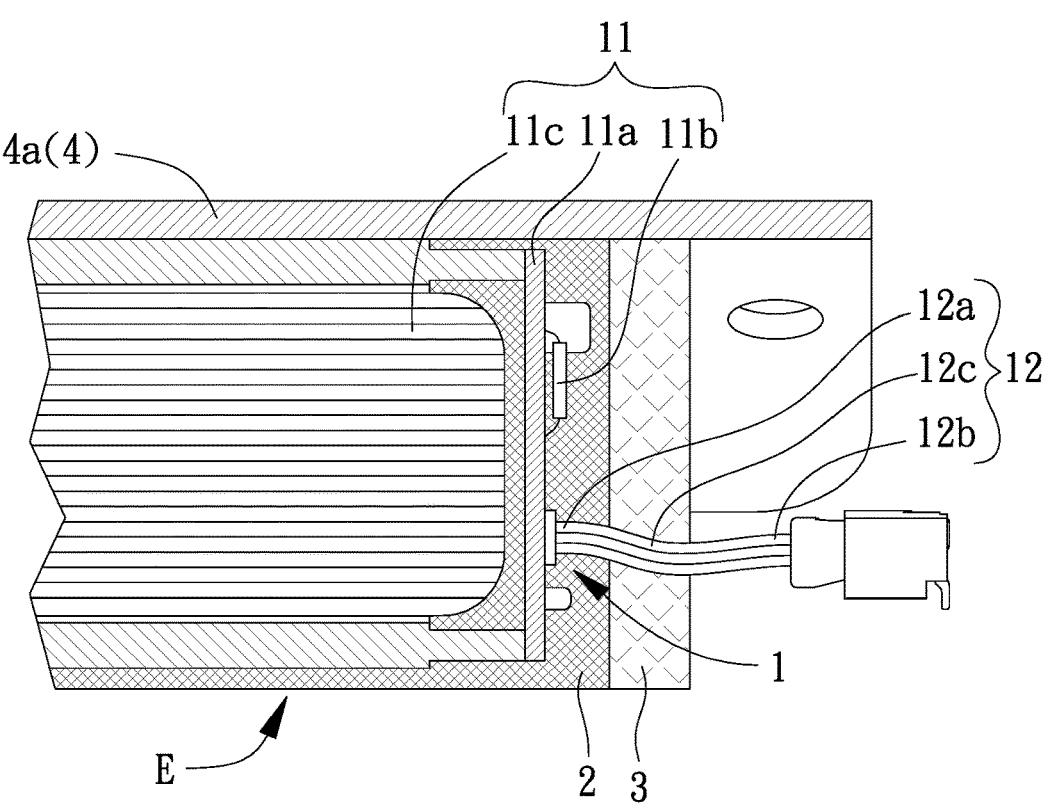
FIG. 6 is a cross sectional view taken along section line 6-6 of FIG. 5.

With reference to FIGS. 5 and 6, the electrical assembly structure E may also be applicable to an array motor. The stator S includes the casing unit 4 and a plurality of the above-mentioned electrical assembly structures E. The casing unit 4 is an annular member comprised of a plurality of casing parts 4a. Each of the plurality of electrical assembly structures E is coupled with a respective one of the plurality of casing parts 4a, such that each electric circuitry 1 is located in the casing unit 4. Each electric unit 11 includes a coil unit 11c electrically connected to the respective lead wire 12. The inner section 12a of each lead wire 12 is connected to the respective circuit board 11a to provide electrical connection between each coil unit 11c and the respective lead wire 12. The circuit board 11a, the electronic elements 11b, the coil unit 11c, and the inner section 12a of the lead wire 12 of each of the plurality of electrical assembly structures E are covered by the first waterproof layer 2. The second waterproof layer 3 is closer to the opening 41 than the first waterproof layer 2. The second waterproof layer 3 covers the intermediate section 12c of the lead wire 12. The outer section 12b of the lead wire 12 is exposed outside the second waterproof layer 3. Thus, since each of the plurality of electrical assembly structures E is coupled with a respective casing part 4a, the stator S forms a plurality of independently separable items. If any electrical assembly structure E is damaged, only the damaged electrical assembly structure E needs to be removed for replacement or maintenance, which is convenient for repairing and detachment/assembly.

Figure 7:
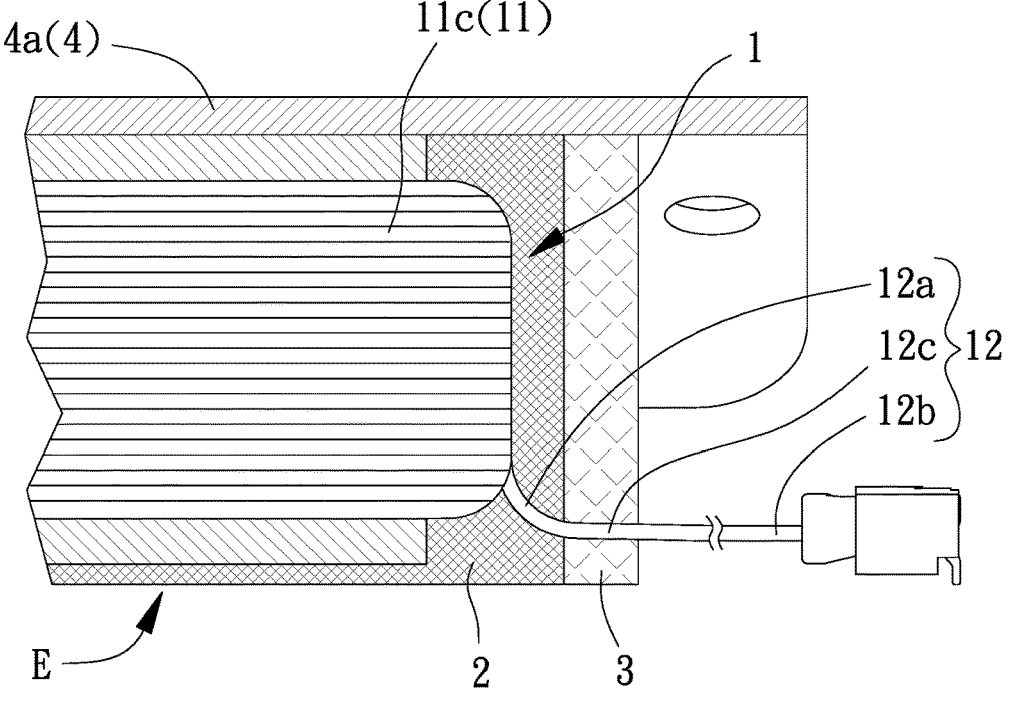
FIG. 7 is a cross sectional view illustrating application of the electrical assembly structure according to the present invention on an array motor without circuit board.

In other embodiments, the electric circuitry 1 may be free of the circuit board 11a, as shown in FIG. 7, and the lead wire 12 may be directly connected to the coil unit 11c. Preferably, each lead wire 12 is integrally connected to the respective coil unit 11c to simplify the components.

In summary, in the electrical assembly structure and the motor including the electrical assembly structure according to the present invention, aside from the first waterproof layer covering the electric unit and the inner section, the second waterproof layer is further provided to cover the intermediate section and is connected to the first waterproof layer. Furthermore, the material of the second waterproof layer is softer than the material of the first waterproof layer. When the lead wire is subject to a pressure and forms the deformation area, the second waterproof layer can immediately fill the deformation area due to the softness characteristics of the second waterproof layer per se. This avoids external liquid from flowing into the electric unit via the deformation area, thereby achieving a waterproof function under high pressure. Furthermore, in a motor having a plurality of electrical assembly structures, by the coupling between each of the plurality of electrical assembly structures and a respective casing part, the stator forms a plurality of independently separable items. If any electrical assembly structure is damaged, only the damaged electrical assembly structure needs to be removed for replacement or maintenance, which is convenient for repairing and detachment/assembly.

Although the present invention has been described with respect to the above preferred embodiments, these embodiments are not intended to restrict the present invention. Various changes and modifications on the above embodiments made by any person skilled in the art without departing from the spirit and scope of the present invention are still within the technical category protected by the present invention. Accordingly, the scope of the present invention shall include the literal meaning set forth in the appended claims and all changes which come within the range of equivalency of the claims. Furthermore, in a case that several of the above embodiments can be combined, the present invention includes the implementation of any combination.

What is claimed is:

1. A motor comprising:
a stator including a casing unit and a plurality of the electrical assembly structures, wherein the casing unit is an annular member comprised of a plurality of casing parts and
a rotor rotatably mounted to the stator;
wherein each of the plurality of electrical assembly structures includes:
an electric unit and a lead wire electrically connected to the electric unit, wherein the lead wire includes an inner section, an outer section, and an intermediate section between the inner section and the outer section, and wherein the inner section is connected to the electric unit;
a first waterproof layer covering the electric unit and the inner section; and
a second waterproof layer covering the intermediate section and connected to the first waterproof layer, wherein the second waterproof layer is located between the outer section and the first waterproof layer, wherein the outer section is exposed outside the second waterproof layer, and wherein a material of the second waterproof layer is softer than a material of the first waterproof layer; and
wherein each of the plurality of electrical assembly structures is coupled with a respective one of the plurality of casing parts, such that each electric circuitry is located in the casing unit, and wherein the electric unit of each electric circuitry includes a coil unit electrically connected to a respective lead wire.

2. The motor as claimed in claim 1, wherein the first waterproof layer is made of polyurethane or thermosetting material.

3. The motor as claimed in claim 1, wherein the second waterproof layer is made of polymer material, rubber or silicone.

4. The motor as claimed in claim 1, wherein the first waterproof layer is formed by potting or injection molding.

5. The motor as claimed in claim 1, wherein the second waterproof layer is formed by potting or injection molding.

6. The motor as claimed in claim 1, wherein each of the plurality of electric units includes a circuit board electrically connected to a respective coil unit, and wherein each inner section is connected to a respective circuit board.

7. The motor as claimed in claim 6, wherein each electric unit includes a plurality of electronic elements disposed on the respective circuit board, and wherein each of the plurality of electronic elements is covered by a respective first waterproof layer.

8. The motor as claimed in claim 1, wherein each lead wire is integrally connected to the respective coil unit.

* * * * *